United States Patent
Pegington et al.

(10) Patent No.: US 11,788,001 B2
(45) Date of Patent: Oct. 17, 2023

(54) ORGANIC LIGHT EMITTING POLYMER COMPRISING LIGHT-EMITTING REPEAT UNIT IN BACKBONE OF POLYMER AND DEVICE THEREWITH

(71) Applicants: Cambridge Display Technology Limited, Godmanchester (GB); Sumitomo Chemical Company Limited, Tokyo (JP)

(72) Inventors: Ruth Pegington, Godmanchester (GB); Michael Cass, Cambridge (GB); David Mohamad, Godmanchester (GB); Matthew Roberts, Godmanchester (GB); William Tarran, Godmanchester (GB); Martin Humphries, Godmanchester (GB)

(73) Assignee: Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 17/103,784

(22) Filed: Nov. 24, 2020

(65) Prior Publication Data
US 2021/0079296 A1  Mar. 18, 2021

Related U.S. Application Data

(63) Continuation of application No. 15/551,423, filed as application No. PCT/GB2016/050410 on Feb. 18, 2016, now Pat. No. 10,870,796.

(30) Foreign Application Priority Data

Feb. 18, 2015 (GB) .................................... 1502731
Jun. 26, 2015 (GB) .................................... 1511300

(51) Int. Cl.
| | | |
|---|---|---|
| C09K 11/06 | (2006.01) | |
| C08G 61/02 | (2006.01) | |
| C08G 61/12 | (2006.01) | |
| H10K 85/10 | (2023.01) | |
| H10K 85/30 | (2023.01) | |
| H10K 50/11 | (2023.01) | |

(Continued)

(52) U.S. Cl.
CPC .............. *C09K 11/06* (2013.01); *C08G 61/02* (2013.01); *C08G 61/12* (2013.01); *H10K 85/111* (2023.02);
(Continued)

(58) Field of Classification Search
CPC . C09K 11/06; H01L 51/0043; H01L 51/0085; H01L 51/0077; C08G 61/122; C08G 2261/3142
(Continued)

(56) References Cited

U.S. PATENT DOCUMENTS

| 2006/0063026 A1 | 3/2006 | Holmes et al. |
| 2016/0240785 A1 | 8/2016 | Cass et al. |
| 2018/0037812 A1 | 2/2018 | Pegington et al. |

FOREIGN PATENT DOCUMENTS

| CN | 101689615 A | 3/2010 |
| CN | 102417587 A | 4/2012 |

(Continued)

OTHER PUBLICATIONS

Chinese Office Action from Chinese Application No. 201680008500.7 dated Jun. 11, 2019.
(Continued)

*Primary Examiner* — Ruiyun Zhang
(74) *Attorney, Agent, or Firm* — Wolf, Greenfield & Sacks, P.C.

(57) ABSTRACT

A light-emitting polymer comprising a light-emitting repeat unit in a backbone of the polymer, wherein the polymer has an anisotropy of no more than 0.8 and wherein a transition dipole moment of the light-emitting repeat unit is aligned with the polymer backbone.

17 Claims, 6 Drawing Sheets

(51) Int. Cl.
*H10K 85/60* (2023.01)
*H10K 101/00* (2023.01)
*H10K 101/10* (2023.01)
*H10K 102/10* (2023.01)

(52) U.S. Cl.
CPC ......... *H10K 85/151* (2023.02); *H10K 85/342* (2023.02); *H10K 85/361* (2023.02); *C08G 61/122* (2013.01); *C08G 2261/11* (2013.01); *C08G 2261/122* (2013.01); *C08G 2261/1412* (2013.01); *C08G 2261/312* (2013.01); *C08G 2261/3142* (2013.01); *C08G 2261/3422* (2013.01); *C08G 2261/374* (2013.01); *C08G 2261/411* (2013.01); *C08G 2261/5242* (2013.01); *C08G 2261/95* (2013.01); *H10K 50/11* (2023.02); *H10K 85/30* (2023.02); *H10K 85/623* (2023.02); *H10K 2101/00* (2023.02); *H10K 2101/10* (2023.02); *H10K 2102/103* (2023.02)

(58) Field of Classification Search
USPC ...... 428/690, 917; 427/64; 257/40, E51.044; 313/504, 506
See application file for complete search history.

(56) References Cited

FOREIGN PATENT DOCUMENTS

| | | | |
|---|---|---|---|
| CN | 102471465 | A | 5/2012 |
| CN | 102725326 | A | 10/2012 |
| CN | 102725878 | A | 10/2012 |
| CN | 103270111 | A | 8/2013 |
| EP | 2 465 888 | A1 | 6/2012 |
| EP | 2 530 099 | A1 | 12/2012 |
| EP | 2 530 758 | A1 | 12/2012 |
| EP | 2 530 759 | A1 | 12/2012 |
| WO | WO 03/091355 | A2 | 11/2003 |
| WO | WO 2009/001953 | A1 | 12/2008 |

OTHER PUBLICATIONS

Combined Search and Examination Report for British Application No. GB1502731.1, dated Sep. 7, 2015.

International Search Report and Written Opinion for International Application No. PCT/GB2016/050410, dated Jul. 20, 2016.

Zhao et al. Promising Optoelectronic Materials: Polymers Containing Phosphorescent Iridium (III) Complexes. 2010. Macromolecular Rapid Communications.31:794-807. doi:10.1002/marc.200900888.

(CRU)—(CRU)—(LERU)—(CRU)—(LERU)—(CRU)—(CRU)—(LERU)—

TMDV

TDMV

CRUS    LERU

ORGANIC LIGHT EMITTING POLYMER COMPRISING LIGHT-EMITTING REPEAT UNIT IN BACKBONE OF POLYMER AND DEVICE THEREWITH

RELATED APPLICATIONS

This application is a continuation of U.S. application Ser. No. 15/551,423, filed Aug. 16, 2017, which is a national stage filing under 35 U.S.C. § 371 of international PCT application, PCT/GB2016/050410, filed Feb. 18, 2016, which claims priority to United Kingdom patent application, GB 1511300.4, filed Jun. 26, 2015, and to United Kingdom patent application, GB 1502731.1, filed Feb. 18, 2015, each of which is incorporated herein by reference in its entirety.

BACKGROUND

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED comprises an anode, a cathode and one or more organic light-emitting layers between the anode and cathode. Non-emissive layers, for example charge transporting layers and charge transporting layers, may be provided between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Light-emitting materials include small molecule, polymeric and dendrimeric materials. Fluorescent light-emitting polymers include poly(arylene vinylenes) such as poly(p-phenylene vinylenes) and polyarylenes such as polyfluorenes.

A light-emitting dopant, for example a fluorescent or phosphorescent dopant, may be used with a charge-transporting host material.

A significant proportion of light generated within an OLED may reflect or be absorbed within the device, limiting the external quantum efficiency of the device.

Kim et al, Adv. Mater. 26(23), 3844-3847, 2014 "Highly Efficient Organic Light-Emitting Diodes with Phosphorescent Emitters Having High Quantum Yield and Horizontal Orientation of Transition Dipole Moments" discloses a heteroleptic iridium complex having a preferred dipole orientation in the horizontal direction.

U.S. Pat. No. 8,809,841 disclose a device wherein a transition dipole moment of a luminescent center material is parallel to a top surface of a substrate, and wherein a transition dipole moment of a host material is parallel to the top surface of the substrate.

It is an object of the invention to improve the efficiency of organic light-emitting devices.

It is a further object of the invention to provide high efficiency phosphorescent light-emitting polymers.

SUMMARY OF THE INVENTION

In a first aspect the invention provides a light-emitting polymer comprising a light-emitting repeat unit in a backbone of the polymer, wherein the polymer has an anisotropy factor α of no more than 0.8 and wherein a transition dipole moment of the light-emitting repeat unit is aligned with the polymer backbone.

In a second aspect the invention provides a light-emitting polymer comprising a phosphorescent repeat unit in a backbone of the polymer wherein a transition dipole moment of the phosphorescent repeat unit is aligned with the polymer backbone.

In a third aspect the invention provides an organic light-emitting device comprising an anode, a cathode and a light-emitting layer between the anode and the cathode wherein the light-emitting layer comprises a polymer according to the first or second aspect.

In a fourth aspect the invention provides a method of forming an organic light-emitting device according to the third aspect, the method comprising the step of forming the light-emitting layer by depositing a polymer according to any of claims by a solution deposition method.

In a fifth aspect the invention provides a method of forming a polymer comprising a light-emitting repeat unit in a backbone of the polymer, the method comprising the steps of:

determining an orientation of a transition dipole moment of a light-emitting unit; and polymerising the light-emitting unit to form light-emitting repeat units in the polymer backbone, wherein the light-emitting unit is polymerised such that the transition dipole moment of the light-emitting unit is aligned with the polymer backbone.

The polymer may be as described in the first aspect.

In a sixth aspect the invention provides a light-emitting polymer comprising a light-emitting repeat unit of formula (Va) or (Vb):

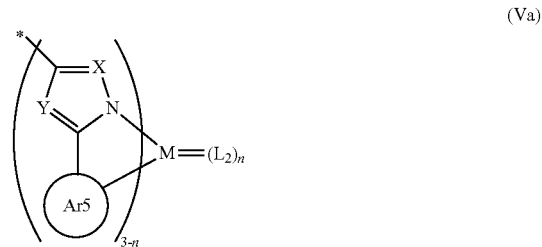

(Va)

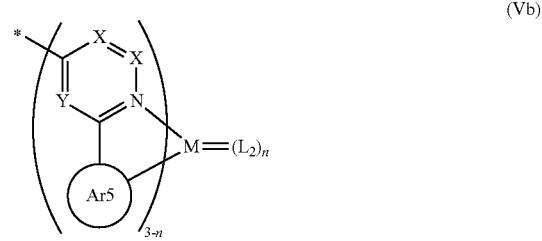

(Vb)

wherein M is a metal, preferably a transition metal; $Ar^5$ is an aromatic group; each X is independently N or $CR^{14}$ wherein $R^{14}$ independently in each occurrence is H or a substituent and two groups $R^{14}$ bound to the same ring may be linked to form a ring; each Y is independently N or $CR^{15}$ wherein each $R^{15}$ independently is H or a substituent; $L^2$ is a ligand; and n is 0, 1 or 2.

The polymer according to the sixth aspect may be provided in a light-emitting device as described with reference to the third aspect.

In a seventh aspect the invention provides a light-emitting polymer comprising a light-emitting repeat unit in a backbone of the polymer wherein:

the light-emitting repeat unit has a first binding position having a first bond vector, a second binding position having a second bond vector and a transition dipole moment having a transition dipole moment vector;

an average of a first angle between the first bond vector and the transition dipole moment vector and a second angle between the second bond vector and the transition dipole moment vector is no more than about 30°; and the polymer has an anisotropy factor α of no more than 0.8.

The light-emitting repeat unit of the polymer of the seventh aspect may be a fluorescent or phosphorescent light-emitting repeat unit as described anywhere herein. The polymer of the seventh aspect may comprise co-repeat units as described anywhere herein.

The polymer according to the seventh aspect may be provided in a light-emitting device as described with reference to the third aspect.

In an eighth aspect the invention provides a monomer of formula (Va-m) or (Vb-m):

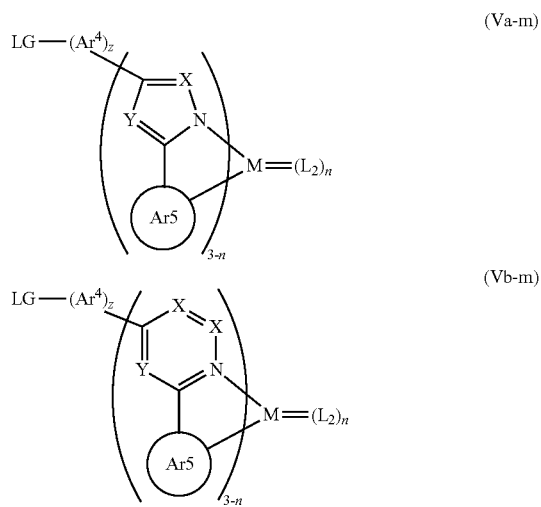

wherein X, Y, Ar$^5$, M, n and L$^2$ are as described with reference to repeat units of formulae (Va) and (Vb); LG is a leaving group; Ar$^4$ is an aryl or heteroaryl group; and z is 0, 1, 2 or 3.

Preferably, LG in each occurrence is selected from halogen; boronic acid and esters thereof; and sulfonic acid and esters thereof, more preferably bromine, iodine, boronic acid or boronic ester.

Ar$^4$ is preferably a 1,4-linked phenylene which may be unsubstituted or substituted with one or more substituents, optionally one or more $C_{1-12}$ alkyl groups wherein one or more non-adjacent C atoms may be replaced with O, S, CO or COO. z is preferably 0 or 1. Two or more substituents of Ar$^4$ may be linked to form, with Ar$^4$, a fused aromatic group which may be unsubstituted or substituted with one or more substituents, optionally one or more $C_{1-12}$ alkyl groups wherein one or more non-adjacent C atoms may be replaced with O, S, CO or COO.

In a ninth aspect the invention provides a method of forming a polymer, the method comprising the step of polymerizing a monomer according to the eighth aspect.

Preferably, the monomer according to the eighth aspect is copolymerized with one or more co-monomers for forming one or more co-repeat units.

DESCRIPTION OF THE DRAWINGS

The invention will now be described in more detail with reference to the Drawings in which.

DETAILED DESCRIPTION OF THE INVENTION

Figures 1, 2:
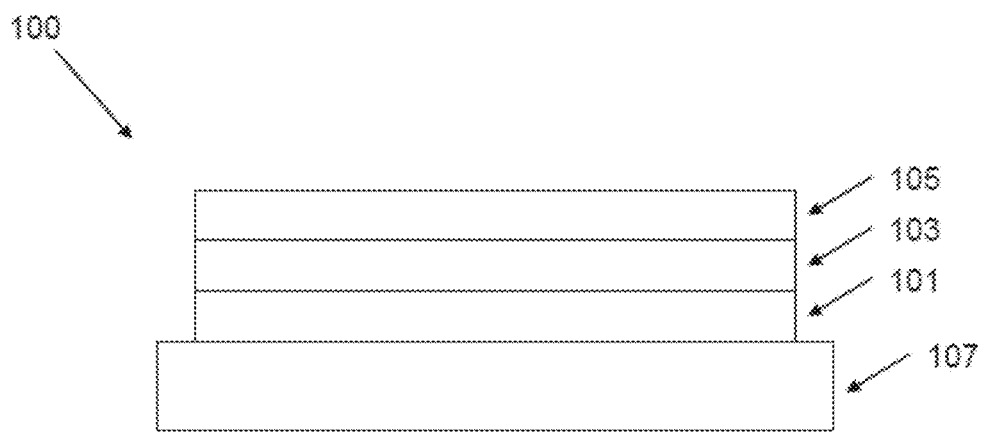
FIG. 1 is a schematic illustration of an OLED according to an embodiment of the invention.
FIG. 2 is an illustration of a section of the backbone of a polymer according to an embodiment of the invention.

With reference to FIG. 1, an OLED 100 according to an embodiment of the invention has an anode 101, a cathode 105 and a light-emitting layer 103 between the anode and the cathode. The device is supported on a substrate 107, which may be a glass or plastic substrate.

One or more further layers may be provided between the anode and the cathode. Optionally, further layers may be selected from one or more of a hole-injection layer, a hole-transporting layer, an electron-blocking layer, a electron-transporting layer and an electron blocking layer.

Exemplary OLED layer structures include the following:
Anode/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, a hole-injection layer is present between the anode and the light-emitting layer.

Preferably, a hole-transporting layer is present between the anode and the light-emitting layer.

Preferably, both of a hole-injection layer and a hole-transporting layer are present.

In one embodiment, substantially all light is emitted from light-emitting layer 103. In other embodiments, one or more further layers may emit light in addition to light-emitting layer 103.

The light-emitting layer 103 contains a light-emitting polymer. The light-emitting polymer contains a light-emitting repeat unit having a transition dipole moment that is aligned with the polymer backbone.

The present inventors have found that high external quantum efficiencies can be achieved by binding a light-emitting repeat unit into light-emitting polymer, preferably an anisotropic light-emitting polymer, such that the transition dipole moment of the light-emitting polymer is aligned with the polymer backbone.

FIG. 2 illustrates a section of a polymer backbone according to an embodiment of the invention comprising light-emitting repeat units (LERU) having a transition dipole moment aligned with the polymer backbone. The light-emitting repeat units are bound into the repeat unit through first and second binding atoms of the repeat unit such that the transition dipole moments of the light-emitting repeat units are aligned with the polymer backbone.

The light-emitting polymer is preferably a conjugated polymer.

The light-emitting polymer may be, without limitation, a random copolymer as illustrated in FIG. 2; an alternating copolymer; or a block copolymer. Preferably, the light-emitting polymer is a random copolymer comprising light-emitting repeat units separated from one another by co-repeat unit segments wherein each co-repeat unit segment consists of a single co-repeat unit or a chain of co-repeat units.

"Aligned with the polymer backbone" as used herein means that binding positions of the light-emitting repeat unit binding the light-emitting repeat unit to adjacent repeat units are such that an angle between a vector of the transition dipole moment of the light-emitting repeat unit and each of the bond vectors of the bonds binding the light-emitting repeat unit to adjacent repeat units in the polymer backbone is a minimum value.

Figure 3A:
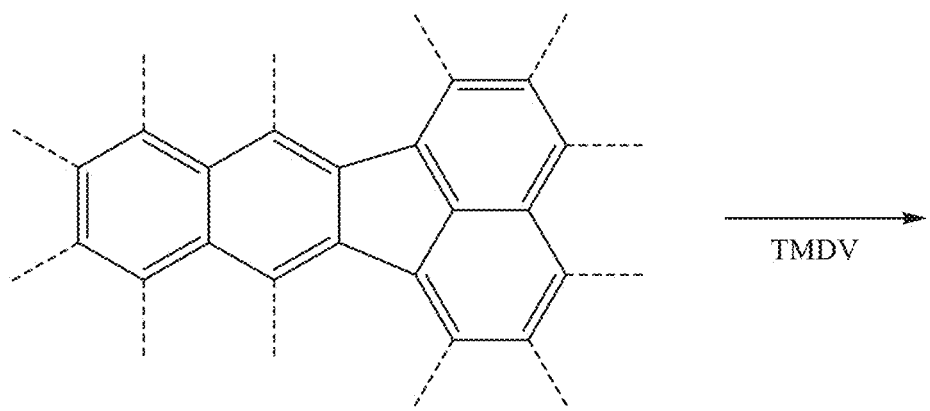
FIG. 3A illustrates a fluorescent unit.

FIG. 3A illustrates a fluoranthene fluorescent light-emitting unit. The light-emitting unit may be polymerised to form a light-emitting repeat unit by binding it to adjacent repeat units through any two of the positions illustrated with a dotted line. The present inventors have found that the transition dipole moment of this light-emitting unit is oriented as shown for transition dipole moment vector TDMV.

The light-emitting repeat unit will have a first bond a with a first bond vector A having a direction "in" to the repeat unit and a second bond b with a second bond vector B having a direction "out" of the repeat unit.

For each bond, the angle between the bond vector and the transition dipole moment can be found from the dot-product of the bond vector and the transition dipole moment vector given by:

$$\vec{A} \cdot \vec{T} = |A||T|\cos\theta_1$$

wherein A is the bond vector for bond a and T is the transition dipole moment vector. |A| and |T| are magnitudes of vectors; and $\theta_1$ is the angle between the bond vector and the transition dipole moment vector. The same applies for bond b.

Figure 3B:
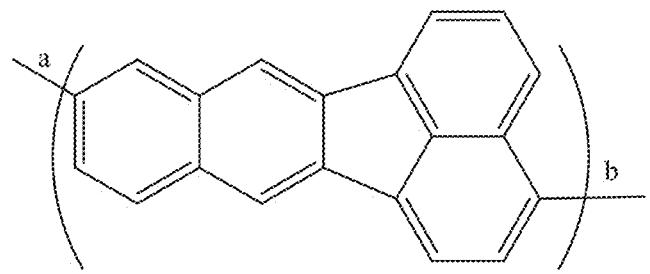
FIG. 3B illustrates a fluorescent repeat unit according to an embodiment of the invention formed from the fluorescent unit of FIG. 3A.

FIG. 3B illustrates a light-emitting repeat unit formed from the light-emitting unit of FIG. 3A. The binding positions are selected to give the minimum angle $\theta_1$ between each bond vector and the transition dipole moment vector (it will be understood that for any given bond, the value of $\theta_1$ may be the same as or different from the $\theta_1$ value of any other bond). The binding positions are selected such that $\theta_1$ is a minimum value (sin $\theta_1$ is a minimum value).

Figure 3C:
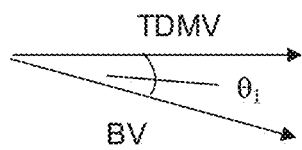
FIG. 3C illustrates an angle between a bond vector of a bond "a" and the transition dipole moment vector of the repeat unit of FIG. 3B.

FIG. 3C illustrates the angle $\theta_1$ between the bond vector for bond a and the transition dipole moment vector TMDV of the light-emitting repeat unit of FIG. 3B. An average of the angles $\theta_1$ for bonds a and b is preferably no more than about 30°, optionally no more than about 20°, optionally no more than about 10°.

Figure 4A:
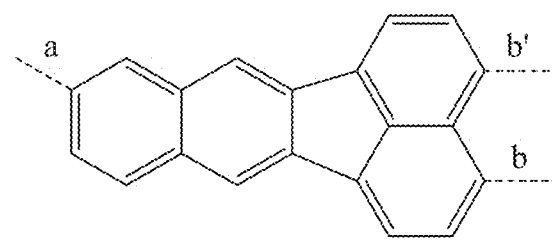
FIG. 4A illustrates binding positions of a fluorescent unit that have the same or similar bond vectors.

Two or more possible binding positions of a light-emitting repeat unit may give the same or similar bond vectors. As illustrated in FIG. 4A, $\theta_1$ for bond b will be the same as or similar to $\theta_1$ for bond b'

In the case where a minimum value $\theta_1$ exists for more than one binding position, either position may be used. In this case, factors besides alignment with the polymer backbone may be taken into account including, without limitation, extent of conjugation to adjacent repeat units, ease of monomer synthesis and rotational degrees of freedom of the repeat unit.

Preferably, the bond vectors have the same direction along the polymer backbone. "Same direction" as used herein means that an angle between the bond vectors is less than 90°. For example, and with reference to FIG. 4A, binding the repeat unit through a bond b having a vector direction in to the repeat unit and bond b' having a vector direction out of the repeat unit gives a low $\theta_1$ value for each bond, but the bond vectors for bonds b and b' are in opposing directions along the polymer backbone. Accordingly, the repeat unit is preferably bound through bonds a and b.

Preferably, an angle between the bond vectors A and B is less than 45°, preferably less than 30°, preferably less than 20° and optionally no more than about 10°.

Figure 4B:
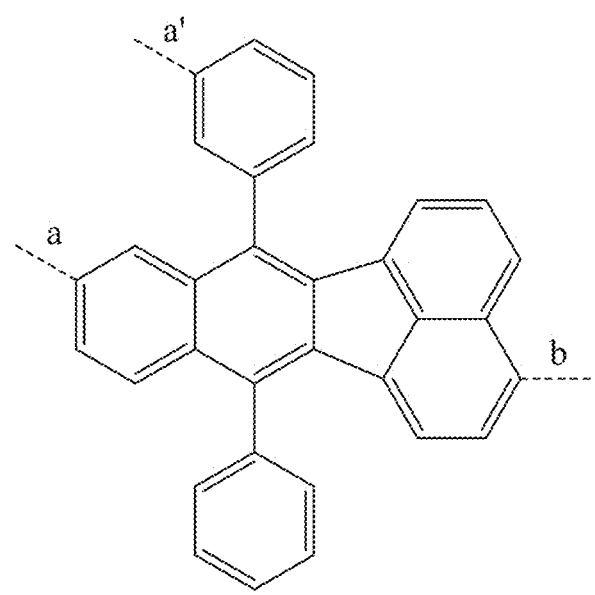
FIG. 4B illustrates binding positions of a substituted fluorescent unit that have the same or similar bond vectors.

In the case where the light-emitting unit is a substituted light-emitting unit, one or both of the binding positions may be on a substituent. With reference to FIG. 4B, $\theta_1$ of a diphenylfluoranthene light-emitting repeat unit is the same or similar for bonds a and a'.

Figure 4C:
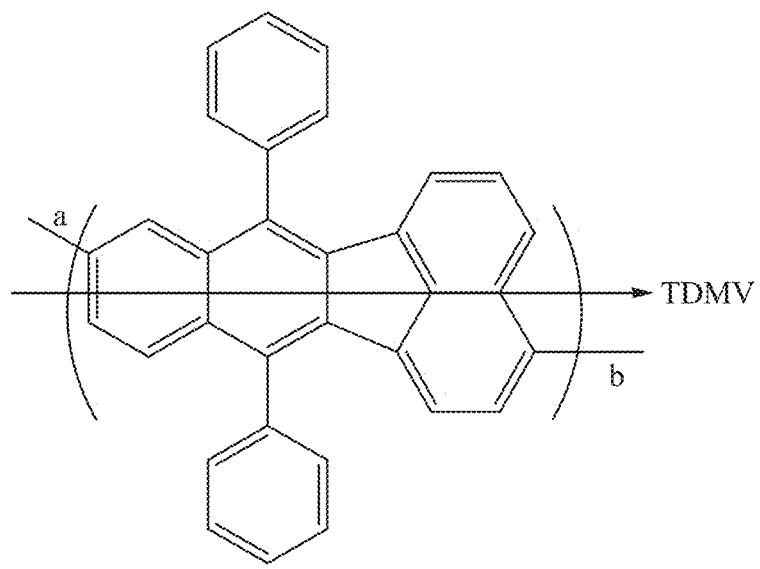
FIG. 4C illustrates distances of binding positions of a fluorescent repeat unit from a line parallel to a transition dipole moment vector of the repeat unit.

Preferably, the binding positions are selected to minimise the total number of rotation points within the monomer and/or to minimise the number of different rotational degrees of freedom of the repeat unit along the polymer backbone. For example, binding the light-emitting unit of FIG. 4B through positions a' and b produces a repeat unit that can rotate about the single bond between the phenyl group and the fluoranthene group of FIG. 4B. No such rotational degree of freedom exists for binding through positions a and b as illustrated in FIG. 4C.

Figure 5A:
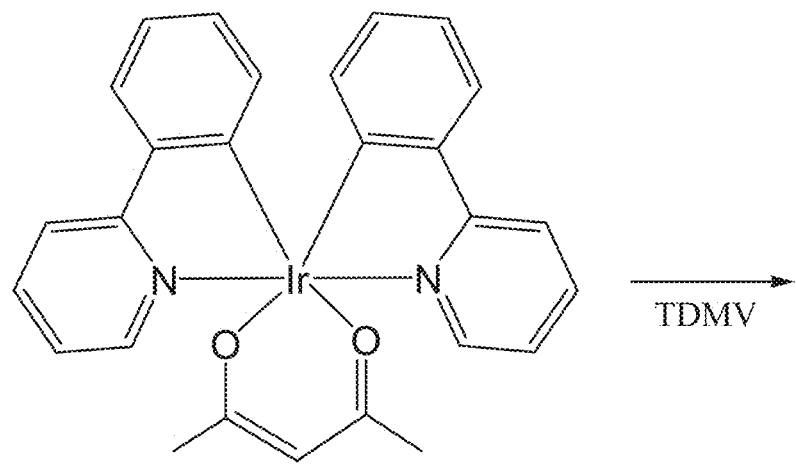
FIG. 5A illustrates a phosphorescent unit.
Figure 5B:
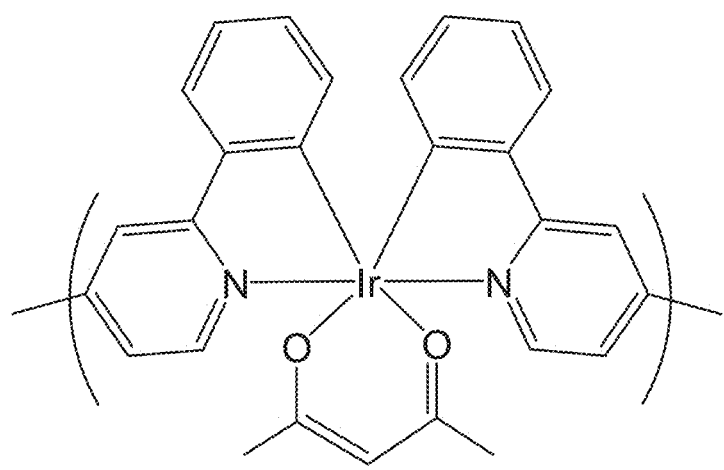
FIG. 5B illustrates a phosphorescent repeat unit according to an embodiment of the invention formed from the phosphorescent unit of FIG. 4A.

FIG. 5A illustrates a phosphorescent light-emitting unit of a metal-to-ligand charge transfer (MLCT) complex comprising an iridium complex with C,N-cyclometalating ligands. The present inventors have found that the transition dipole moment of complexes with C,N-cyclometalated ligands is oriented with the metal-nitrogen bond. In the case of an iridium complex comprising two (and only two) C,N-cyclometalated ligands the transition dipole moment is oriented with a line between the two nitrogen atoms—i.e. the N atoms are in a trans arrangement with the metal atom or ion, in this case an iridium ion.

With reference to FIG. 4B, a light-emitting repeat unit formed from the light-emitting unit of FIG. 4A is bound such that the transition dipole moment is aligned with the polymer backbone.

In the case where the light-emitting repeat unit is a phosphorescent metal complex, the repeat unit is preferably bound such that the metal of the phosphorescent metal complex is in the polymer backbone.

Figure 6:
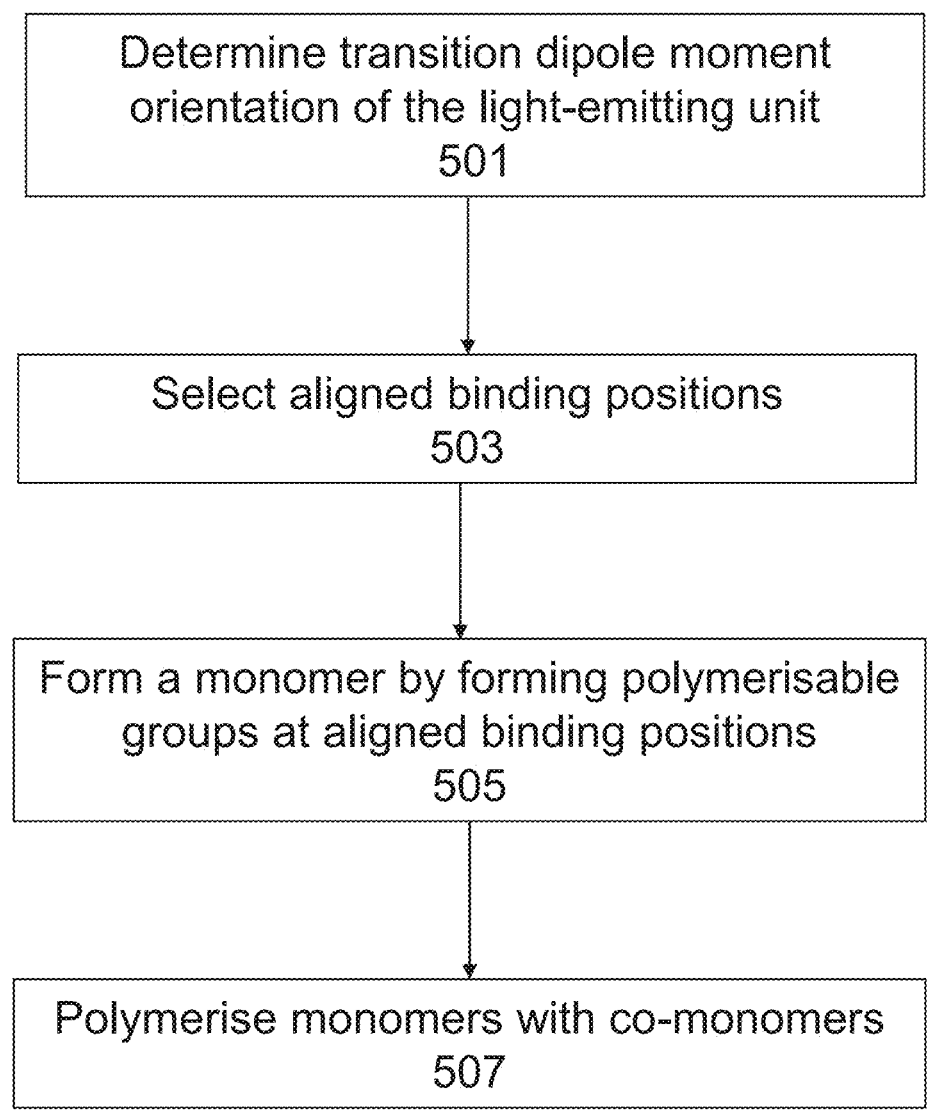
FIG. 6 is a flowchart of a process for forming a polymer according to an embodiment of the invention.

With reference to FIG. 6, to form the light emitting polymer the orientation of the transition dipole moment of a fluorescent or phosphorescent light-emitting unit is determined, if not already known, in step 501.

The transition dipole moment vector of a fluorescent light-emitting unit and bond vectors of a fluorescent light-emitting repeat unit formed from the fluorescent light-emitting unit may be determined by quantum chemical modelling using Gaussian09 software available from Gaussian, Inc. according to the following steps:
(i) Optimise the ground state geometry of the molecule using a DFT calculation in using B3LYP/6-31g(d).
(ii) Using this geometry, use time dependent density functional theory to calculate the excited states of the molecule. The transition dipole moment is calculated along with the energy for singlet excited states.

For a phosphorescent light-emitting unit the same method is used and the transition dipole moment of the lowest triplet excited state is taken to match that of the lowest singlet excited state. "lanl2dz" is used for phosphorescent light-emitting repeat units, in particular iridium light-emitting repeat units.

In step 503 two binding positions that give alignment of the repeat unit with the polymer backbone are selected. One or more of the following further parameters may be applied in selecting the binding positions of the repeat unit:
(i) the combination giving fewest bonds having rotational freedom along the polymer backbone;
(ii) the combination giving the smallest value for the angle between the bond vectors of the light-emitting repeat unit.
(iii) the combination such that each atom through which the light-emitting repeat unit is bound is no more than one bond from a line parallel to the transition dipole moment vector; and
(iv) in the case of a phosphorescent metal complex, a combination in which the metal is in the polymer backbone.

For example, if more than one bond gives the same minimum $\theta_1$ value for a bond into the repeat unit or the same minimum $\theta_1$ value for a bond out of the repeat unit then the binding positions may be selected according to one or more of (i)-(iv).

In step 505 two polymerisable groups are provided on the light-emitting unit to form a light-emitting monomer. The polymerisable groups are bound to atoms of the light-emitting unit such that the resulting repeat unit is aligned with the polymer backbone.

In step 507 the light-emitting monomer is polymerised with one or more co-monomers to form a light-emitting polymer comprising light-emitting repeat units formed from the light-emitting monomer.

Figure 7:
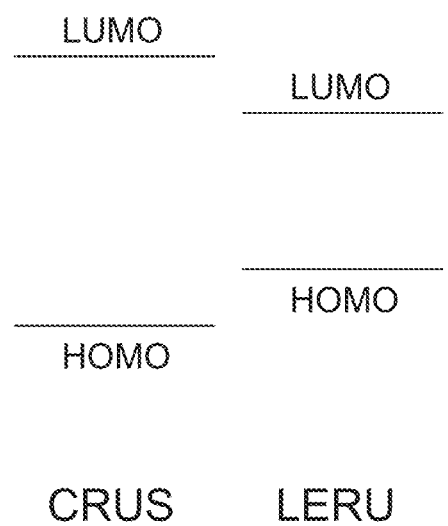
FIG. 7 is an illustration of HOMO and LUMO levels of components of a polymer according to an embodiment of the invention.

FIG. 7 illustrates the HOMO and LUMO levels of a light-emitting repeat unit (LERU) and a co-repeat unit segment (CRUS), which may be a single co-repeat unit or a chain of co-repeat units. The light-emitting repeat unit of a conjugated polymer preferably has a HOMO level that is closer to vacuum that that of the co-repeat unit segment, and a LUMO level that is further from vacuum than that of the co-repeat unit segment.

Preferably, the HOMO of the light-emitting repeat unit is at least 0.1 eV, optionally at least 0.2 eV, closer to vacuum than that of the co-repeat unit segment.

Preferably, the LUMO of the light-emitting repeat unit is at least 0.1 eV, optionally at least 0.2 eV, further from vacuum than that of the co-repeat unit segment.

HOMO and LUMO levels may be measured by square wave voltammetry.

The HOMO and LUMO levels of the light-emitting repeat unit may be taken from measurements of the corresponding light-emitting unit, in which the bonds to adjacent repeat units of the light-emitting repeat unit are replaced with bonds to H.

The HOMO and LUMO levels of the remaining polymer, formed of the co-repeat units, may be taken from a measurement of a polymer consisting only of the co-repeat units.

Polymers as described herein suitably have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of the polymers described herein may be $1\times10^3$ to $1\times10^8$, and preferably $1\times10^4$ to $1\times10^7$.

Polymers as described herein are preferably amorphous.

Light-Emitting Units

The light-emitting unit may be, without limitation, a red, green or blue light-emitting repeat unit.

A blue light emitting unit may have a photoluminescent spectrum with a peak in the range of 400-490 nm.

A green light emitting unit may have a photoluminescent spectrum with a peak in the range of more than 490 nm up to 580 nm.

A red light emitting unit may optionally have a peak in its photoluminescent spectrum of more than 580 nm up to 650 nm, preferably 600-630 nm.

The photoluminescence spectrum of a light-emitting unit may be measured by casting 5 wt % of the material in a PMMA film onto a quartz substrate to achieve transmittance values of 0.3-0.4 and measuring in a nitrogen environment using apparatus C9920-02 supplied by Hamamatsu.

The light-emitting repeat unit may be a fluorescent or phosphorescent light-emitting repeat unit. The polymer may contain only one light-emitting repeat unit or may contain two or more different light-emitting repeat units with the proviso that the transition dipole moment of at least one of the light-emitting repeat units is aligned with the polymer backbone.

Exemplary fluorescent repeat units are $C_{10-40}$ aromatic hydrocarbon repeat units, optionally $C_{14-40}$ aromatic hydrocarbon repeat units, that may be unsubstituted or substituted with one or more substituents. Exemplary fluorescent repeat units include, without limitation, anthracene, fluoranthene and perylene.

Exemplary aligned fluorescent hydrocarbon repeat units have the following structures:

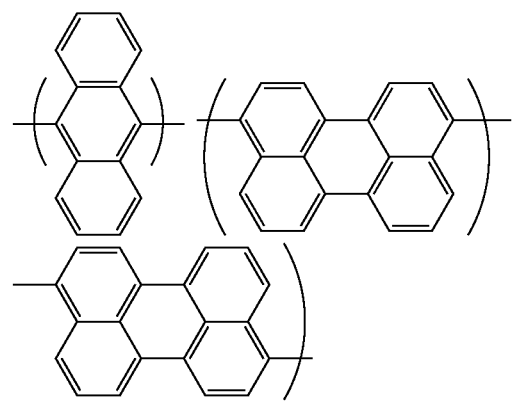

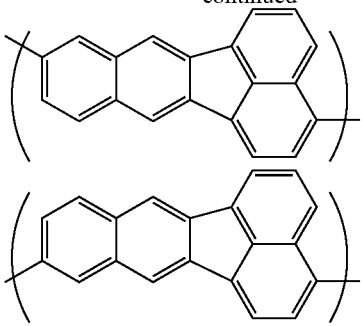

The fluorescent $C_{10\text{-}40}$ aromatic hydrocarbon repeat unit may be unsubstituted or substituted with one or more substituents. Optionally, substituents are selected from the group consisting of:

- alkyl, optionally $C_{1\text{-}20}$ alkyl, wherein one or more non-adjacent C atoms may be replaced with optionally substituted aryl or heteroaryl, O, S, substituted N, C=O or —COO—, and one or more H atoms may be replaced with F; and
- a group of formula —$(Ar^3)_r$, wherein each $Ar^3$ is independently an aryl or heteroaryl group that may be unsubstituted or substituted with one or more substituents and r is at least 1, optionally 1, 2 or 3.

Preferably, $Ar^3$ independently in each occurrence is a $C_{6\text{-}20}$ aryl group, optionally phenyl, that may be unsubstituted or substituted with one or more substituents, optionally one or more $C_{1\text{-}20}$ alkyl groups.

—$(Ar^3)_r$ may form a branched or linear group of aryl or heteroaryl groups when r is greater than 2.

Preferred phosphorescent repeat units are transition metal complexes, preferably iridium complexes.

Exemplary phosphorescent repeat units have formula (I):

wherein M is a metal; each of $L^1$, $L^2$ and $L^3$ is a ligand that independently in each occurrence may be unsubstituted or substituted with one or more substituents; q is a positive integer; and r and s are each independently 0 or a positive integer.

The sum of (a·q)+(b·r)+(c·s) is equal to the number of coordination sites available on M, wherein a is the number of coordination sites on $L^1$, b is the number of coordination sites on $L^2$ and c is the number of coordination sites on $L^3$.

a, b and c are preferably each independently 1, 2 or 3. Preferably, a, b and c are each a bidentate ligand (a, b and c are each 2).

Preferably, the metal complex is heteroleptic. In a preferred embodiment, q is 2, r is 1 and s is 0. In another preferred embodiment, q is 1, r is 2 and s is 0.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. M may be a metal atom or ion, preferably an ion. Iridium (III) is particularly preferred.

Preferably, $L^1$ is a ligand suitable for producing MLCT.

Optionally, $L^1$ has formula (II):

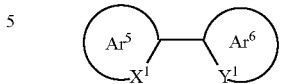

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together.

Ligands wherein $X^1$ is carbon and $Y^1$ is nitrogen (C,N-cyclometalated ligands) are preferred, more preferably ligands in which $Ar^5$ is a single ring or fused aromatic group, for example phenyl or naphthyl and $Ar^6$ is a single ring or fused heteroaromatic of N and C atoms only, for example pyridyl or isoquinoline.

To achieve red emission, $Ar^5$ may be selected from phenyl, fluorene, naphthyl and $Ar^6$ may be selected from quinoline, isoquinoline, thiophene and benzothiophene.

To achieve green emission, $Ar^5$ may be selected from phenyl or fluorene and $Ar^6$ may be pyridine.

To achieve blue emission, $Ar^5$ may be phenyl and $Ar^6$ may be selected from imidazole, pyrazole, triazole and tetrazole.

Examples of bidentate ligands of formula (II) are illustrated below:

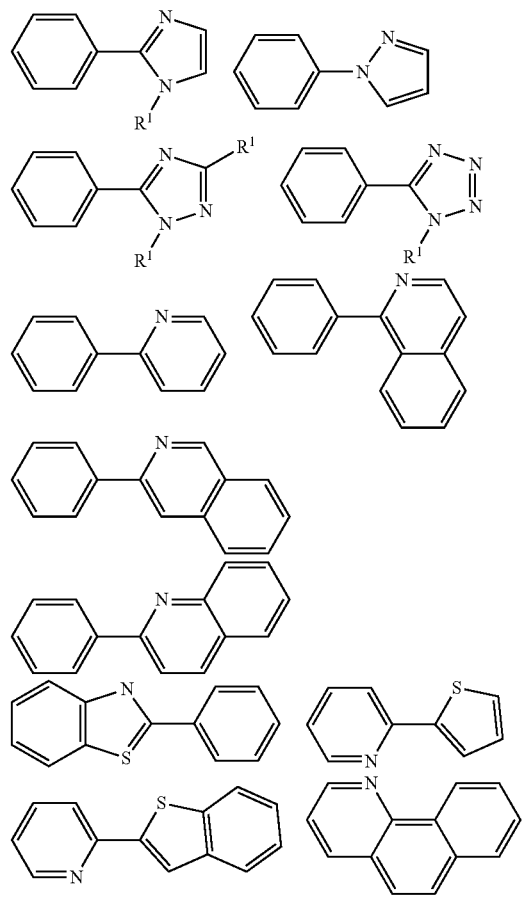

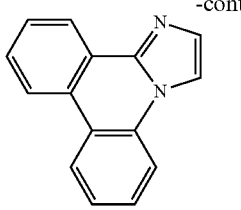

wherein $R^1$ is a substituent as described below.

In another embodiment, $L^1$ may comprise a carbene co-ordinating group.

Preferably, the phosphorescent repeat unit has one or two ligands $L^1$ selected from ligands of formula (II) or ligands $L^1$ comprising a carbene coordinating group, the or each ligand $L^1$ being bound through a binding position for alignment with the polymer backbone as described herein. The or each ligand $L^1$ bound into the polymer backbone may be bound directly to an adjacent co-repeat unit or may be spaced apart therefrom, optionally spaced apart by a group of formula $(Ar^4)_z$, as described with reference to formulae (Va-m) and (Vb-m).

Ligands $L^1$ may be unsubstituted or may be substituted with or more substituents. Two or more of these substituents may be linked to form a ring, for example an aromatic ring.

Substituents of ligand $L^1$ may be substituents $R^1$, wherein $R^1$ is selected from:

- $C_{1-20}$ alkyl wherein one or more H atoms may be replaced with F and wherein one or more non-adjacent C atoms may be replaced with O, S, C=O, COO or NR wherein R is $C_{1-20}$ hydrocarbyl, optionally $C_{1-20}$ alkyl or phenyl that may be unsubstituted or substituted with one or more $C_{1-10}$ alkyl groups;
- fluorine; and
- $—(Ar^3)_b$ wherein each $Ar^3$ is independently an aryl or heteroaryl group that may be unsubstituted or substituted with one or more substituents and b is at least 1, optionally 1 2 or 3

$Ar^3$ in each occurrence is preferably a $C_{6-20}$ aryl group, more preferably phenyl. The group $—(Ar^3)_b$ may form a linear or branched chain of aryl or heteroaryl groups in the case where r is at least 2. Preferred substituents of $Ar^3$ are $C_{1-20}$ alkyl groups.

Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; phenyl or biphenyl which may be unsubstituted or substituted with one or more $C_{1-10}$ alkyl groups; and dendrons which may be used to obtain or enhance solution processability of the metal complex, for example as disclosed in WO 02/66552.

The phosphorescent repeat unit may be a dendrimeric phosphorescent repeat unit comprising a core of formula (I) wherein at least one ligand $L^1$ is substituted with at least one dendron. Each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (III)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (IIIa):

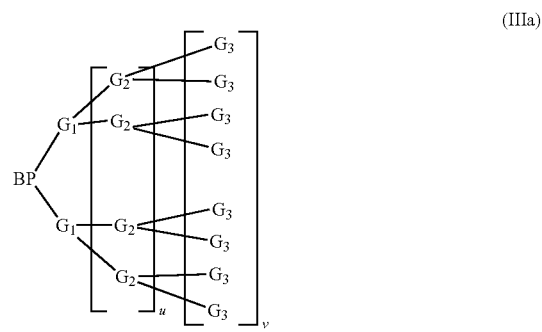

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ ... $G_n$ is phenyl, and each phenyl BP, $G_1$, $G_2$ ... $G_{n-1}$ is a 3,5-linked phenyl.

A preferred dendron is a substituted or unsubstituted dendron of formula (IIIb):

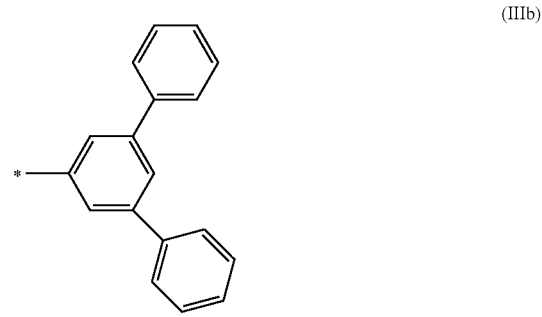

wherein * represents an attachment point of the dendron to $L^1$.

BP and/or any group G may be substituted with one or more substituents, for example one or more $C_{1-20}$ alkyl or alkoxy groups.

In one preferred embodiment, q is 2 and $L^1$ is a C,N-cyclometalating ligand; r is 1; and s is 0.

Exemplary ligands $L^2$ are:
N,N-chelating ligands, optionally pyridine carboxamides; pyridyl pyrazolates; pyridyl triazolates; amidates;

N,O-chelating ligands, optionally picolinate or iminophenol; and

O,O-chelating ligands, optionally diketonates; or acetates.

N,O-chelating ligands include a ligand of formula (VIII):

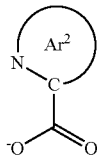

(VIII)

wherein $Ar^2$ is a heteroaryl, preferably a 5-10 membered heteroaryl of C and N atoms that may be unsubstituted or substituted with one or more substituents, optionally one or more $C_{1-10}$ alkyl groups.

Exemplary N,N-chelating ligands have formula (XIII):

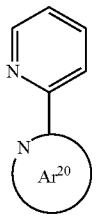

(XIII)

wherein $Ar^{20}$ independently in each occurrence is a 5-10 membered heteroaryl group, optionally a 5-membered heteroaryl containing N and C atoms, optionally pyrazole or triazole.

Ligands of formula (IV) may be unsubstituted or may be substituted with one or more substituents. Exemplary substituents are $C_{6-10}$ aryl or 5-10 membered heteroaryl groups, optionally phenyl that may be unsubstituted or substituted with one or more substituents, and $C_{1-10}$ alkyl wherein one or more non-adjacent C atoms may be replaced with O, S, C=O or COO and one or more H atoms may be replaced with F.

Exemplary ligands of formula (XIII) are:

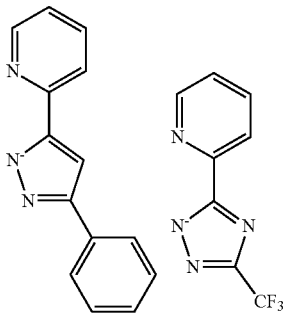 [SMILES: c1ccc(-c2cc(-c3ccccn3)[n-]n2)cc1 ; FC(F)(F)c1n[n-]c(-c2ccccn2)n1]

Preferred ligands $L^2$ are selected from diketonates, in particular acetylacetonate (acac) which may be unsubstituted or substituted with one or more substituents, and carbenes.

$L^2$ may be a ligand of formula (IV):

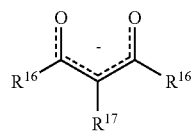

(IV)

wherein $R^{16}$ in each occurrence is independently a substituent, preferably $C_{1-10}$ alkyl and $R^{17}$ is H or a substituent, preferably H or $C_{1-10}$ alkyl; and wherein one $R^{16}$ and $R^{17}$ may be linked to form a ring, optionally a 6-10 membered aromatic or heteroaromatic ring that may be unsubstituted or substituted with one or more substituents, optionally one or more substituents selected from $C_{1-20}$ hydrocarbyl groups.

Exemplary ligands of formula (IV) are acac and:

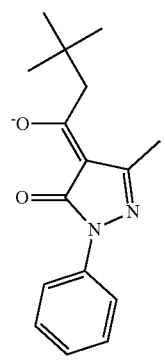

Preferred phosphorescent light-emitting repeat units contain one or two MLCT-producing ligands wherein the or each transition dipole moment associated with the or each ligand is aligned with the polymer backbone.

Preferred phosphorescent light-emitting repeat units comprising a ligand of formula (II) have formula (Va) or (Vb):

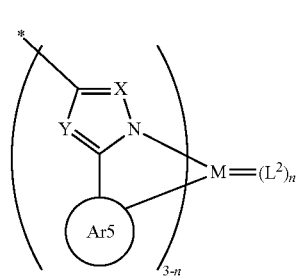

(Va)

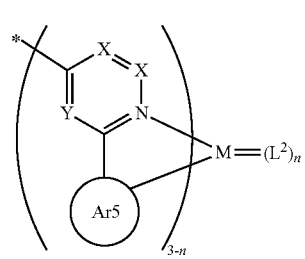

(Vb)

wherein $Ar^5$ is an aromatic group, preferably a $C_{6-20}$ aryl group, more preferably phenyl or naphthyl; each X is independently N or $CR^{14}$ wherein $R^{14}$ independently in each occurrence is H or a substituent and two groups $R^{14}$ bound to the same ring may be linked to form a ring; each Y is independently N or $CR^{15}$ wherein each $R^{15}$ independently is H or a substituent; $L^2$ is a ligand as described above; and n is 0, 1 or 2. $L^2$ is different from the ligand of formula (II) of formula (Va) or (Vb).

The repeat units of formula (Va) or (Vb) may be bound directly to an adjacent co-repeat unit or may be spaced apart therefrom, optionally spaced apart by a group of formula $(Ar^4)_z$, as described with reference to formulae (Va-m) and (Vb-m).

A substituent of Y and a substituent of $Ar^5$ may be linked to form a ring.

Preferably, $R^{14}$ and $R^{15}$ are each, independently in each occurrence, H or $R^1$ wherein $R^1$ is as described above. Preferably, n is 1 or 2. More preferably, n is 1.

Co-Repeat Units

The light-emitting polymer preferably has an anisotropy factor α of no more than 0.8, preferably no more than 0.7, more preferably no more than 0.5. The value of the anisotropy factor α may be affected by the structure and/or molar percentage of the light-emitting repeat unit and/or co-repeat units. Co-repeat units may be selected to give, in combination with an aligned light-emitting repeat unit, a required anisotropy factor α of the polymer.

Suitable co-repeat units include electron-transporting co-repeat units; hole-transporting co-repeat units; and light-emitting co-repeat units wherein the transition dipole moment of the light-emitting co-repeat unit is not aligned with the polymer backbone.

The co-repeat units may form a rod-like backbone.

Optionally, the light-emitting polymer may comprise co-repeat units of formula (VI):

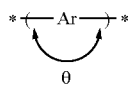

(VI)

wherein Ar is an aryl or heteroaryl group, more preferably a $C_{6-20}$ aryl group, that may be unsubstituted or substituted with one or more substituents, and angle θ is 140°-180°

Optionally, angle θ is 160°-180°, optionally 170°-180° Optionally, 1-99 mol %, optionally 10-90 mol % or 20-80 mol % of repeat units of the polymer may be repeat units of formula (VI). Exemplary repeat units of formula (VI) include, without limitation, 1,4-linked phenylene repeat units; 2,7-linked fluorene repeat units; 2-8-linked phenanthrene repeat units; 2,8-linked dihydrophenanthrene repeat units; and 2,7-linked triphenylene repeat units.

Preferably, at least one co-repeat unit is substituted with at least one solubilising group, optionally a $C_{1-20}$ alkyl group or a phenyl substituted with one or more $C_{1-20}$ alkyl groups.

The 1,4-phenylene repeat unit may have formula (VII)

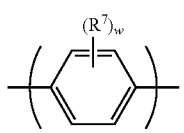

(VII)

wherein w in each occurrence is independently 0, 1, 2, 3 or 4, optionally 1 or 2; and $R^7$ independently in each occurrence is a substituent Where present, each $R^7$ may independently be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups; and —$(Ar^1)_c$ wherein each $Ar^1$ is independently an aryl or heteroaryl group that may be unsubstituted or substituted with one or more substituents and c is at least 1, optionally 1 2 or 3

$Ar^1$ in each occurrence is preferably a $C_{6-20}$ aryl group, more preferably phenyl. The group —$(Ar^1)_c$ may form a linear or branched chain of aryl or heteroaryl groups in the case where c is at least 2. Preferred substituents of $Ar^1$ are $C_{1-20}$ alkyl groups.

Substituted N, where present, may be —$NR^2$— wherein $R^2$ is $C_{1-20}$ alkyl; unsubstituted phenyl; or phenyl substituted with one or more $C_{1-20}$ alkyl groups.

Preferably, each $R^7$ is independently selected from $C_{1-40}$ hydrocarbyl, and is more preferably selected from $C_{1-20}$ alkyl; unsubstituted phenyl; and phenyl substituted with one or more $C_{1-20}$ alkyl groups; and a linear or branched chain of phenyl groups, wherein each phenyl may be unsubstituted or substituted with one or more substituents.

Substituents $R^7$ of formula (VII), if present, are adjacent to linking positions of the repeat unit, which may cause steric hindrance between the repeat unit of formula (VII) and adjacent repeat units, resulting in the repeat unit of formula (VII) twisting out of plane relative to one or both adjacent repeat units.

A particularly preferred repeat unit of formula (VII) has formula (VIIa):

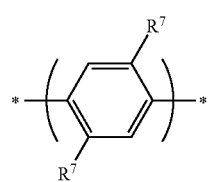

(VIIa)

A 2,7-linked fluorene repeat unit may have formula (IX):

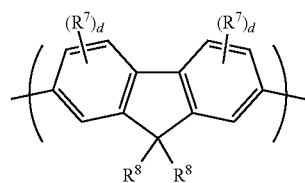

(IX)

wherein $R^8$ in each occurrence is the same or different and is a substituent wherein the two groups $R^8$ may be linked to form a ring; $R^7$ is a substituent as described above; and d is 0, 1, 2 or 3.

Each $R^8$ may independently be selected from the group consisting of:

alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;

aryl and heteroaryl groups that may be unsubstituted or substituted with one or more substituents, preferably phenyl substituted with one or more $C_{1-20}$ alkyl groups; and a linear or branched chain of aryl or heteroaryl groups, each of which groups may independently be substituted, for example a group of formula —$(Ar^7)_d$ wherein each $Ar^7$ is independently an aryl or heteroaryl group and d is at least 2, optionally 2 or 3, preferably a branched or linear chain of phenyl groups each of which may be unsubstituted or substituted with one or more $C_{1-20}$ alkyl groups.

Preferably, each $R^8$ is independently a $C_{1-40}$ hydrocarbyl group.

Different groups $R^8$ are disclosed in WO 2012/104579 the contents of which are incorporated in entirety by reference.

Substituted N, where present, may be —$NR^2$— wherein $R^2$ is as described above.

Exemplary substituents $R^7$ are alkyl, for example $C_{1-20}$ alkyl, wherein one or more non-adjacent C atoms may be replaced with O, S, C=O and —COO—, optionally substituted aryl, optionally substituted heteroaryl, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

The extent of conjugation of repeat units of formula (IX) to aryl or heteroaryl groups of adjacent repeat units in the polymer backbone may be controlled by substituting the repeat unit with one or more substituents $R^8$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VI) may have formula (X) or (XI):

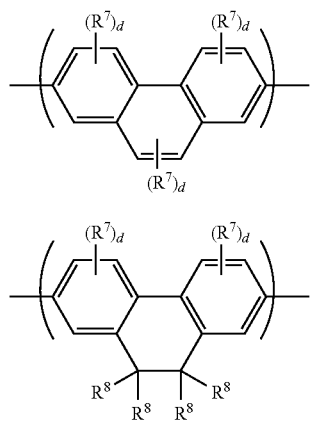

wherein $R^7$, $R^8$ and d are as described with reference to formulae (VII) and (IX) above.

Any of the $R^7$ groups of formulae (X) and (XI) may be linked to any other of the $R^7$ groups to form a ring. The ring so formed may be unsubstituted or may be substituted with one or more substituents, optionally one or more $C_{1-20}$ alkyl groups.

Any of the $R^8$ groups of formula (XI) may be linked to any other of the $R^8$ groups to form a ring. The ring so formed may be unsubstituted or may be substituted with one or more substituents, optionally one or more $C_{1-20}$ alkyl groups.

Up to 50 mol % of the repeat units of the polymer, preferably up to 20 mol % and more preferably up to 10 mol % of the repeat units of the polymer may be light-emitting repeat units having a transition dipole moment aligned with the polymer backbone, the remaining units being co-repeat units.

Polymerisation Method

Conjugated light-emitting polymers as described herein may be formed by metal catalysed polymerisations such as Yamamoto polymerisation and Suzuki polymerisation as disclosed in WO 00/53656, WO 03/091355 and EP1245659, the contents of which are incorporated herein by reference.

Preferably, the polymer is formed by polymerising monomers comprising leaving groups that leave upon polymerisation of the monomers. Preferably, the polymer is formed by polymerising monomers comprising boronic acid and ester groups bound to aromatic carbon atoms of the monomer with monomers comprising leaving groups selected from halogen, sulfonic acid or sulfonic ester, preferably bromine or iodine, bound to aromatic carbon atoms of the monomer in the presence of a palladium (0) or palladium (II) catalyst and a base.

Exemplary boronic esters have formula (XII):

wherein $R^6$ in each occurrence is independently a $C_{1-20}$ alkyl group, * represents the point of attachment of the boronic ester to an aromatic ring of the monomer, and the two groups $R^6$ may be linked to form a ring.

Solution Processing

A light-emitting layer comprising a light-emitting polymer as described herein may be formed by depositing the light-emitting polymer from a solution of the polymer and, if present, any other components of the light-emitting layer, dissolved in a solvent or solvent mixture.

Exemplary solvents are benzenes substituted with one or more substituents selected from $C_{1-10}$ alkyl, $C_{1-10}$ alkoxy and chlorine, for example toluene, xylenes and methylanisoles.

Exemplary solution deposition techniques include printing and coating techniques such spin-coating, dip-coating, flexographic printing, inkjet printing, slot-die coating and screen printing. Spin-coating and inkjet printing are particularly preferred.

Spin-coating is particularly suitable for devices wherein patterning of the light-emitting layer is unnecessary—for example for lighting applications or simple monochrome segmented displays.

The light-emitting layer may be annealed following deposition. Preferably, annealing is below the glass transition temperature of the polymer.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device).

The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Additional layers between the anode and cathode of an OLED, where present, may be formed by a solution deposition method as described herein.

Hole Injection Layers

A conductive hole injection layer, which may be formed from a conductive organic or inorganic material, may be provided between the anode and the light-emitting layer or layers of an OLED to improve hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Where a hole-transporting layer is present, a hole-injection layer may be provided between the anode and the hole-transporting layer.

Charge Transporting and Charge Blocking Layers

A hole transporting layer may be provided between the anode and the light-emitting layer or layers. An electron transporting layer may be provided between the cathode and the light-emitting layer or layers.

An electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A hole transporting layer preferably has a HOMO level of less than or equal to 5.5 eV, more preferably around 4.8-5.5 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers. The hole-transporting layer may be a polymer comprising arylamine repeat units, for example as described in WO 99/54385, WO 2005/049546, WO2013/108022 or WO2013/108023, the contents of which are incorporated herein by reference. A polymer comprising arylamine repeat units may be a homopolymer or may comprise one or more co-repeat units, optionally a $C_{1-40}$ arylene repeat unit that may be unsubstituted or substituted with one or more substituents, optionally one or more $C_{1-40}$ hydrocarbyl groups. Exemplary arylene co-repeat units are repeat units of formulae (VII), (IX), (X) and (XI) as described herein.

A hole-transporting material may be substituted with a crosslinkable group that is reacted to crosslink the hole-transporting material following its deposition. If the hole-transporting material is a polymer then a crosslinkable group may be provided as a substituent of a repeat unit of the polymer, preferably a substituent of an arylene repeat unit of the polymer. A substituent $R^7$ or $R^8$ of an arylene unit as described herein may be a crosslinkable group. Exemplary crosslinkable groups are groups comprising benzocyclobutane which may be unsubstituted or substituted with one or more substituents, optionally one or more $C_{1-10}$ alkyl groups and groups comprising a unit of formula $-CR^{10}=CH_2$ wherein $R^{10}$ is H or a substituent, optionally H or a $C_{1-10}$ alkyl group.

An electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

An electron transporting layer may contain a polymer comprising a chain of optionally substituted arylene repeat units, such as a chain of fluorene repeat units.

Cathode

The cathode is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of conductive materials, for example a plurality of conductive metals such a bilayer of a low workfunction material and a high workfunction material such as calcium and aluminium as disclosed in WO 98/10621. The cathode may comprise a layer of elemental barium, for example as disclosed in WO 98/57381, Appl. Phys. Lett. 2002, 81(4), 634 and WO 02/84759. The cathode may comprise a thin (e.g. 1-5 nm) layer of metal compound between the organic semiconducting layers and one or more conductive cathode layers, in particular an oxide or fluoride of an alkali or alkali earth metal, to assist electron injection, for example lithium fluoride, for example as disclosed in WO 00/48258; barium fluoride, for example as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Measurements

Anisotropy factor α is measured using emission spectroscopy as described in M Flämmich et al, Organic Electronics 12, 2011, p. 1663-1668 the contents of which are incorporated herein by reference. The average dipole orientation can be represented by a vector (x,y,z) where the z direction is normal to the plane of the thin film. This can be further parameterised as the ratio of parallel to perpendicular components $p_∥:p_⊥=(x+y): z$ as used in Flämmich et al, or alternatively as an anisotropy factor $α=z/x=z/y$, as used throughout this document. In this way, isotropic orientation can be represented by (1,1,1), where $p_∥:p_⊥=2:1$ and $α=1$. Additionally, an example of a anisotropic orientation can be represented as (0.3571, 0.3571, 0.2858), where $p_∥:p_⊥=2.5:1$ and $α=0.8$.

Square wave cyclic voltammetry as described anywhere herein may be performed by ramping a working electrode potential linearly versus time. When square wave voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinium counter electrode (donor or acceptor of electrons) and a reference glass electrode no leak Ag/AgCl. Ferrocene is added in the cell at the end of the experiment for calculation purposes.

Measurement of the difference of potential between Ag/AgCl/ferrocene and sample/ferrocene.

Method and Settings:
3 mm diameter glassy carbon working electrode
Ag/AgCl/no leak reference electrode
Pt wire auxiliary electrode
0.1 M tetrabutylammonium hexafluorophosphate in acetonitrile
LUMO=4.8−ferrocene (peak to peak maximum average)+ onset Sample: 1 drop of 5 mg/mL in toluene spun at 3000 rpm LUMO (reduction) measurement:

A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline. HOMO and LUMO values may be measured at ambient temperature.

EXAMPLES

Comparative Model Repeat Unit 1

Comparative Model Repeat Unit 1 was analysed using Gaussian09 software as described herein.

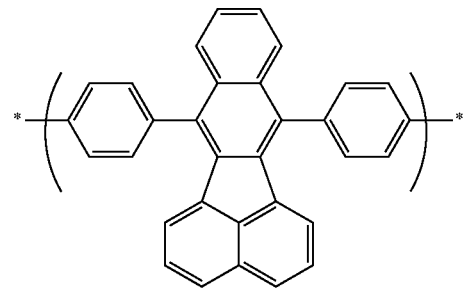

Comparative Model Repeat Unit 1

With reference to FIG. 3A, the transition dipole moment vector was found to be oriented as shown by transition dipole moment vector TDMV, indicating that a polymer comprising Comparative Model Repeat Unit 1 will have a high anisotropy factor α.

Angle $θ_1$ between TDMV and each bond vector was determined to be 89.9°.

Fluorescent Monomer Example 1

The orientation of the transition dipole moment of diphenylfluoranthene unit was determined as described herein using Gaussian09 software available from Gaussian, Inc. The orientation is as illustrated by transition dipole moment vector TDMV in FIG. 3A.

Based on this orientation, Fluorescent Monomer Example 1 (an isomer mixture) for forming an aligned light-emitting repeat unit was formed:

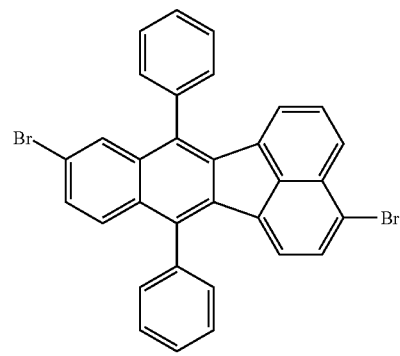

-continued
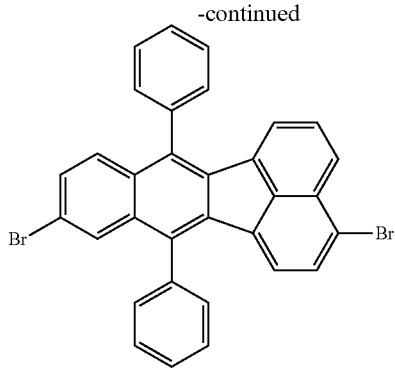
Fluorescent Polymer Example 1
A polymer comprising fluorene repeat units and repeat units formed by polymerisation of Fluorescent Monomer Example 1 was prepared by Suzuki polymerisation as described in WO 00/53656.
Phosphorescent Monomer Example 1
Phosphorescent Monomer Example 1 was prepared according to the following reaction scheme:
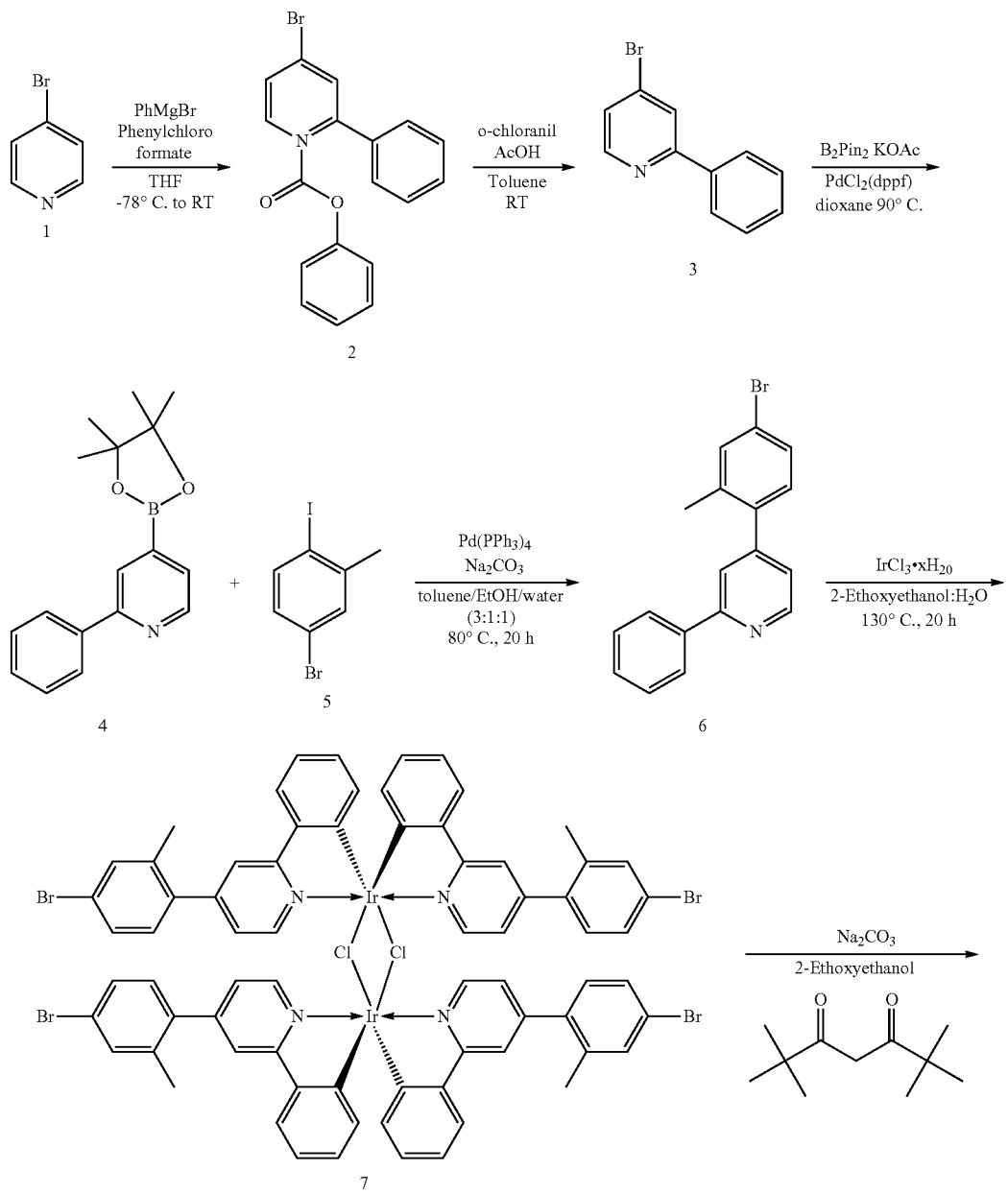

-continued

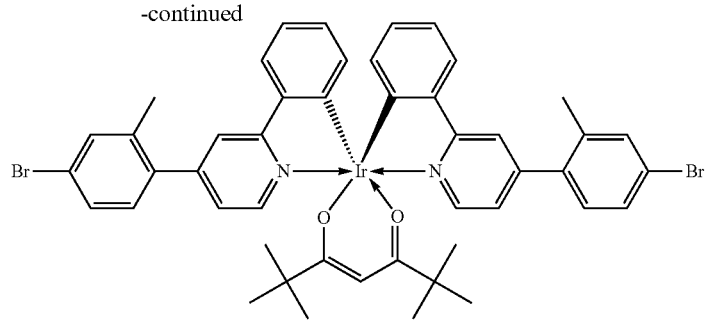

Phosphorescent Monomer Example 1

Step 1: Synthesis of Intermediate 2

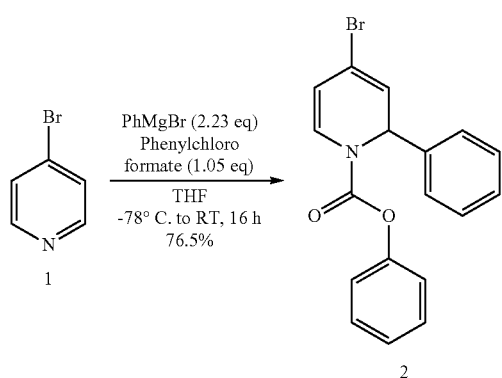 [SMILES: Brc1ccncc1 ; O=C(Oc1ccccc1)N1C=CC(Br)=CC1c1ccccc1]

| S. No | Reagent | Quantity (g) | Vol. (mL) | MW | Moles | Eq. |
|---|---|---|---|---|---|---|
| 1 | 4-Bromo pyridine•HCl | 80 | | 194.49 | 0.4113 | 1 |
| 2 | Phenyl magnesium bromide (1M in THF) | | 917 | 181.31 | 0.9172 | 2.23 |
| 3 | Phenyl chloroformate | | 54.2 | 156.57 | 0.4319 | 1.05 |
| 4 | THF | | 2000 | | | |

Apparatus Set-Up:
A 5 L 3-necked round-bottomed flask, equipped with a mechanical overhead stirrer, thermo socket, nitrogen inlet and exhaust.

Experimental Procedure:
1) A suspension of 4-bromopyridine hydrochloride (80 g, 0.4113 mol) in THF (2000 mL) was taken in the flask.
2) The reaction mixture was cooled to −78° C. and 1M phenyl magnesium bromide (917 mL, 0.9172 mol) was added through additional funnel for 1 h maintaining the inner temperature between −75° C. to −70° C.
3) The reaction mixture was maintained at −78° C. for 30 min.
4) Phenyl chloroformate (54.2 mL, 0.4319 mol) was added drop wise to the reaction mixture at −78° C.
5) The reaction mixture was slowly warmed to room temperature and maintained at room temperature for 16 h.
6) 20% ammonium chloride solution (1000 mL) was added to the reaction mixture.
7) The reaction mixture was extracted with ethyl acetate (2×1000 mL).
8) The combined organic layer was dried over $Na_2SO_4$ and concentrated to give 180 g of crude intermediate 2 as a pale brown viscous oil.
9) The crude was purified by a flash column chromatography over silica gel (230-400 mesh) using 2% ethyl acetate in hexane as eluent to obtain 112 g intermediate 2 with 78.1% HPLC purity as a pale yellow viscous oil (yield=76.5%).

Step 2: Synthesis of Intermediate 3

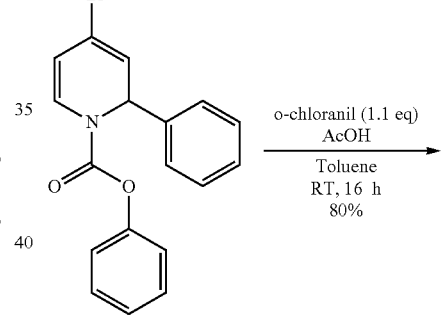

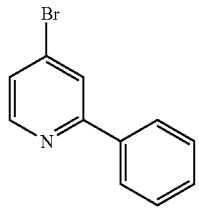

| S. No | Reagent | Quantity (g) | Vol. (mL) | MW | Moles | Eq. |
|---|---|---|---|---|---|---|
| 1 | Intermediate 2 | 112 | | 356.22 | 0.3144 | 1 |
| 2 | o-Chloranil | 85 | | 245.86 | 0.3458 | 1.1 |
| 3 | Glacial Acetic acid | | 1500 | | | |
| 4 | Toluene | | 2000 | | | |

Apparatus Set-Up:
A 5 L 3-necked round-bottomed flask, equipped with mechanical overhead stirrer, nitrogen inlet and exhaust.

Experimental Procedure:
1. The intermediate 2 (112 g, 0.3144 mol) was taken in a 5 L reaction flask with toluene (2000 mL).
2. A solution of o-chloranil (85 g, 0.3458 mol) in acetic acid (1500 mL) was added to the reaction mixture at room temperature during 30 minutes.
3. The reaction mixture was stirred at room temperature for 16 h.
4. Then the mixture was cooled to 0° C. in an ice bath.
5. 20% Aqueous NaOH solution (5 L) was added to the reaction mixture slowly to adjust the pH range between 10 to 11.
6. The solution was extracted with methyl t-butyl ether (2000 mL×3).
7. The combined organic layer was washed with water (2000 mL), brine solution (1500 mL), dried over $Na_2SO_4$ and concentrated to get 108 g of crude 3 as a pale brown viscous oil.
8. The crude product was purified in 3 batches (36 g each) by Grace column chromatography using 2% EtOAc in hexane as eluent to get 58.8 g of 3 with 97.8% HPLC purity as a pale yellow viscous oil. It contained 1.88% of chloro derivative of 3 as impurity (yield=80%).

$^1$H-NMR (400 MHz, $CDCl_3$): δ [ppm] 7.43 (dd, J=1.76, 5.28 Hz, 1H), 7.47-7.53 (m, 3H), 7.93 (d, J=1.72 Hz, 1H), 7.98-8.00 (m, 2H), 8.53 (d, J=5.28 Hz, 1H).

Step 3: Synthesis of Intermediate 4

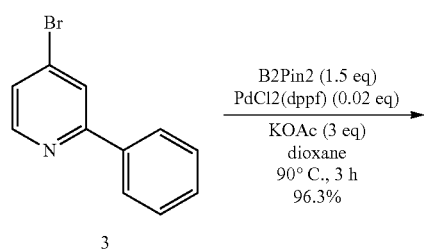

Experimental Procedure:
1. Intermediate 3 (58.8 g, 0.2511 mol) in dioxane (1090 mL) was taken in R. B. flask.
2. Bis(pinacolato)diboron (95.67 g, 0.3768 mol) and potassium acetate (74 g, 0.7533 mol) were added to the mixture.
3. The mixture was degassed with $N_2$ gas for 1 h.
4. $PdCl_2$(dppf) (4.1 g, 0.005 mol) was added to the mixture.
5. The reaction mixture was heated to 90° C. and maintained for 3 h.
6. The reaction mixture was cooled to room temperature and diluted with n-hexane (2 L) and stirred for 40 min and filtered through celite bed.
7. The filtrate was concentrated to obtain 108 g of intermediate 4 as crude product.
8. The crude was purified by column chromatography using neutral $Al_2O_3$ and 5% ethyl acetate in hexane as eluent to afford 68 g of intermediate 4 with 95.93% HPLC purity (yield=96.3%).

Step 4: Synthesis of 6

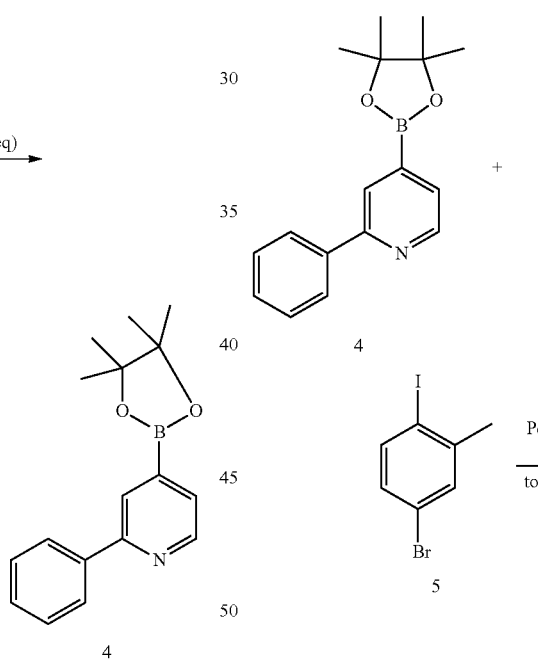

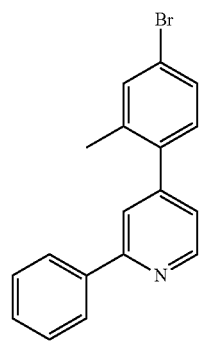

| S. No | Reagent | Quantity (g) | Vol. (mL) | MW | Moles | Eq. |
|---|---|---|---|---|---|---|
| 1 | Intermediate 3 | 58.8 | | 234.1 | 0.2511 | 1 |
| 2 | Bis(pinacolato)diboron | 95.67 | | 253.94 | 0.3768 | 1.5 |
| 3 | Potassium acetate | 74 | | 98.15 | 0.7533 | 3 |
| 4 | $PdCl_2$(dppf)•$CH_2Cl_2$ | 4.1 | | 816.6 | 0.005 | 0.02 |
| 5 | Dioxane | | 1090 | | | |

Apparatus Set-Up:
A 3 L 4-necked round-bottomed flask, equipped with a mechanical overhead stirrer, condenser, nitrogen inlet and exhaust.

| S. No | Reagent | Quantity (g) | Vol. (mL) | MW | Moles | Eq. |
|---|---|---|---|---|---|---|
| 1 | Intermediate (4) | 65 | | 281.1 | 0.2313 | 1 |
| 2 | 5-Bromo-2-iodo toluene (5) | 68.67 | | 296.9 | 0.2313 | 1 |
| 3 | Sodium carbonate | 73.55 | | 106 | 0.6939 | 3 |
| 4 | Pd(PPh$_3$)$_4$ | 5.34 | | 1155.57 | 0.0046 | 0.02 |
| 5 | Toluene/EtOH/water (3:1:1) | | 1700 | | | |

Apparatus Set-Up:

A 5 L 4-necked round-bottomed flask, equipped with a mechanical overhead stirrer, condenser, nitrogen inlet and exhaust.

Experimental Procedure:

1. Intermediate 4 (65 g, 0.2313 mol) and 5-bromo-2-iodo toluene (5) (68.67 g, 0.2313 mol) were taken in toluene/ethanol (3:1) mixture (1360 mL).
2. The mixture was degassed with N$_2$ gas for 40 min.
3. Sodium carbonate (73.55 g, 0.6939 mol) was added followed by the addition of water (340 mL) and purged with N$_2$ gas for 30 min.
4. Pd(PPh$_3$)$_4$ (5.34 g, 0.0046 mol) was added and purged with N$_2$ gas for another 30 min.
5. The reaction mixture was heated to 80° C. and maintained for 20 h.
6. The reaction mixture was cooled to room temperature and water (1.5 L) was added.
7. The organic layer was separated and the aqueous layer was extracted with EtOAc (1000 mL×3).
8. The combined organic layer was washed with water (1.5 L), brine (1.5 L), dried over Na$_2$SO$_4$ and concentrated to get 80 g of crude 6 as a pale brown viscous oil.
9. The crude was purified by repeated column chromatography using 230-400 silica gel and 6% diethyl ether in hexane as eluent to afford 30 g of 6 as a pale orange solid with 99.78% HPLC purity (yield=40%).

$^1$H-NMR (400 MHz, CDCl$_3$): δ [ppm] 2.31 (s, 3H), 7.14-7.19 (m, 2H), 7.43-7.52 (m, 5H), 7.67 (s, 1H), 8.03 (d, J=7.60 Hz, 2H), 8.75 (d, J=5.20 Hz, 1H).

Step 5: Synthesis of 7

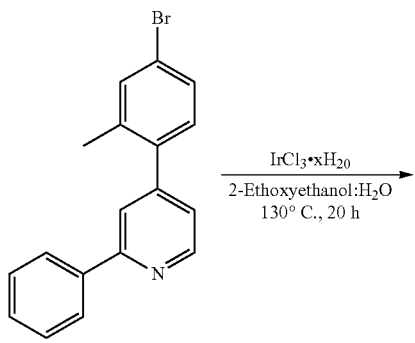

6

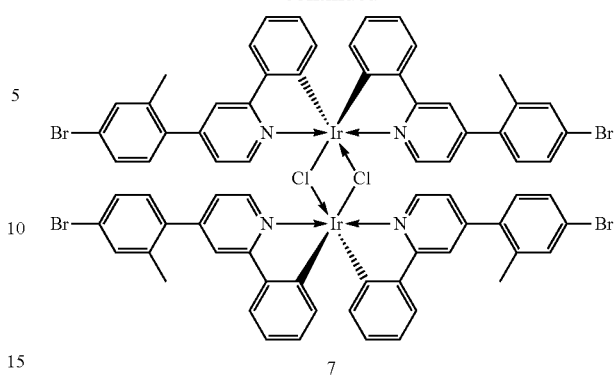

7

| S. No | Reagent | Quantity (g) | Vol. (mL) | MW | Moles | Eq. |
|---|---|---|---|---|---|---|
| 1 | Intermediate (6) | 5 | | 324.22 | 0.0154 | 2.5 |
| 2 | IrCl$_3$ hydrate | 1.84 | | 298.58 | 0.0062 | 1 |
| 3 | 2-ethoxyethanol:H$_2$O (3:1) | | 67 | | | |

Apparatus Set-Up:

A 250 mL 3-necked round-bottomed flask, equipped with a magnetic stirrer, condenser, nitrogen inlet and exhaust.

Experimental Procedure:

1. Intermediate 6 (5 g, 0.0154 mol) and Iridium (III) chloride (1.84 g, 0.0062 mol) were taken in 2-ethoxyethanol:water (3:1) mixture (57 mL).
2. The mixture was degassed with N$_2$ gas for 90 min.
3. The mixture was heated to an oil bath temperature of 130° C. for 20 h.
4. After cooling the reaction mixture to ambient temperature, water (100 mL) was added to precipitate the intermediate 7.
5. The reaction mixture was poured into a beaker containing water (400 mL) and stirred to precipitate the intermediate 7 as a fine yellow powder.
6. The solid was filtered through a glass sinter funnel, the solid was washed with water (200 mL) and dried on the sinter funnel using a diaphragm pump.
7. The dried solid was further washed with methanol (100 mL) then rinsed with heptane (400 mL)
8. The intermediate 7 was dried in a vacuum oven at 50° C. to afford 3.75 g (69.2% yield).

$^1$H-NMR (400 MHz, CDCl$_3$): δ [ppm] 2.31 (s, 12H), 6.05 (d, J=3.7 Hz 4H), 6.63 (t, J=7.5 Hz, 4H), 6.71 (d, J=3 Hz, 4H), 6.78 (t, J=7.5 Hz, 4H), 7.04 (d, J=4 Hz), 7.36 (d, J=4 Hz), 7.49 (d, J=4 Hz, 4H), 7.80 (d, J=0.6 Hz, 4H), 9.39 (d, J=1 Hz, 4H)

Step 6: Synthesis of Phosphorescent Monomer 1

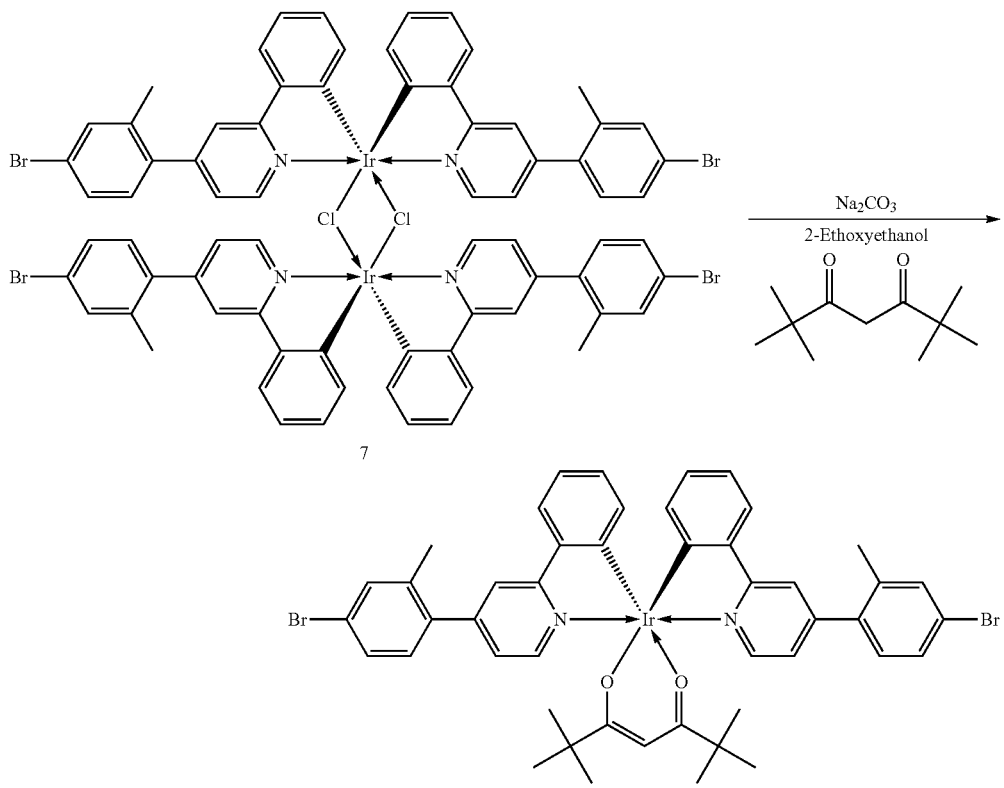

Phosphorescent Monomer Example 1

| S. No | Reagent | Quantity (g) | Vol. (mL) | MW | Moles | Eq. |
|---|---|---|---|---|---|---|
| 1 | Intermediate (7) | 3.27 | | 1762.21 | 0.002 | 1 |
| 2 | 2,2,6,6-tetramethyl heptan-3,5-dione | 1.17 | | 184.28 | 0.0062 | 3 |
| 3 | Sodium carbonate | 2.24 | | 105.99 | 0.022 | 10 |
| 3 | 2-ethoxyethanol | | 37 | | | |

Apparatus Set-Up:
A 250 mL single necked round-bottomed flask, equipped with a magnetic stirrer, condenser, nitrogen inlet and exhaust.

Experimental Procedure:
1. Intermediate 7 (3.27 g, 0.002 mol), 2,2,6,6-tetramethyl heptan-3,5-dione (1.17 g, 0.0062 mol) and sodium carbonate (2.24 g, 0.022 mol) were taken in 2-ethoxyethanol (37 mL)
2. The mixture was degassed with $N_2$ gas for 120 min and then heated to 120° C. for 20 hours.
3. After cooling to room temperature, the mixture was poured into a beaker of water in order to form a precipitate.
4. The precipitate was filtered and washed with water (300 mL) and methanol (100 mL).
5. After the solid was dried under vacuum it was precipitated using a minimum amount of dichloromethane and precipitation into methanol (400 mL).
6. The precipitations were repeated another two times until the desired purity was reached.

After drying at 50° C. in a vacuum oven, Phosphorescent Monomer 1 (1.54 g, 40.6%) was achieved.

$^1$H-NMR (400 MHz, CDCl$_3$): δ [ppm] 0.92 (s, 18H), 2.35 (s, 6H), 5.51 (s, 1H), 6.50 (d, J=4 Hz 2H), 6.73 (t, J=7.4 Hz, 2H), 6.83 (t, J=7.4 Hz, 2H), 7.00 (d, J=3 Hz, 2H), 7.24 (d, J=4.4 Hz, 2H), 7.47 (d, J=4 Hz. 2H), 7.52 (d, J=0.7 Hz, 2H), 7.56 (d, J=3.8 Hz, 2H), 7.56 (d, J=0.7 Hz, 2H), 8.42 (d, J=3 Hz, 2H)

Polymer Example 1

A polymer was prepared by Suzuki polymerisation as described in WO 00/53656 of Monomer 1 (50 mol %); Monomer 2 (43 mol %) and and 7 mol % of Phosphorescent Monomer Example 1.

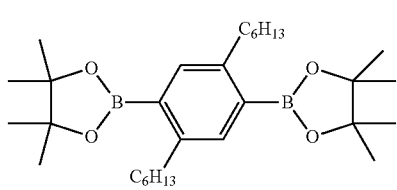

Monomer 1

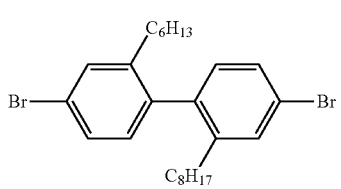

Monomer 2

Polymer Example 1 has an anisotropy factor α of 0.31.

Polymer Example 2

A polymer was prepared by Suzuki polymerisation as described in WO 00/53656 of Monomer 3 (50 mol %); a dibromide monomer (43 mol %) for forming a repeat unit of formula (IX); and 7 mol % of Phosphorescent Monomer Example 1.

Monomer 3

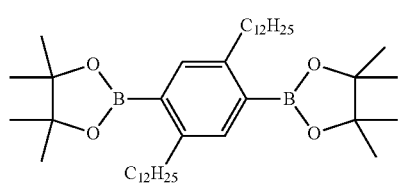

Polymer Example 2 has an anisotropy factor α of 0.17.

Comparative Polymer 1

Comparative Polymer 1 was prepared as described for Polymer Example 2 except that Phosphorescent Monomer Example 1 was replaced with Comparative Phosphorescent Monomer 1:

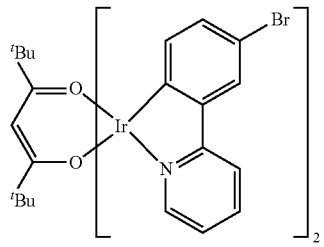

Comparative Polymer 1 has an anisotropy factor α of 1.78.

Device Example 1

An organic light-emitting device having the following structure was prepared:
ITO/HIL/HTL/LEL/Cathode
in which ITO is 45 nm thick layer of indium tin oxide anode; HIL is a 65 nm thick layer formed by spin-coating an aqueous formulation of a hole injection material available from Nissan Chemical Industries Ltd.; HTL is a 20 nm thick hole-transporting polymer formed by spin-coating a hole-transporting polymer from xylene solution and crosslinking the polymer by heating; LEL is a 80 nm thick light-emitting layer formed by spin-coating a composition of Polymer Example 2 (75 mol %) blended with a charge-transporting polymer (25 mol %); and Cathode is formed by evaporating a layer of sodium fluoride (2 nm), a layer of aluminium (100 nm) and a layer of silver (100 nm).

The hole-transporting polymer comprises phenylene repeat units of formula (VIIa), amine repeat units as described in WO 2005/049546 and crosslinkable repeat units of formula (IX).

The charge-transporting polymer was formed by Suzuki polymerisation as described in WO 00/53656 and comprises a repeat unit of formula (VIIa) (50 mol %), a repeat unit of formula (XI) (25 mol %) and a triphenyltriazine repeat unit as described in WO 02/083760 (25 mol %).

Comparative Device 1

A device was prepared as described for Device Example 1 except that the light-emitting layer was formed by spin-coating a composition of Comparative Polymer 1 (60 mol %) and a charge transporting polymer (40 mol %) formed by Suzuki polymerisation as described in WO 00/53656 and comprising a repeat unit of formula (VIIa) (50 mol %), a repeat unit of formula (XI) (40 mol %) and a triphenyltriazine repeat unit as described in WO 02/083760 (10 mol %).

Figure 8:
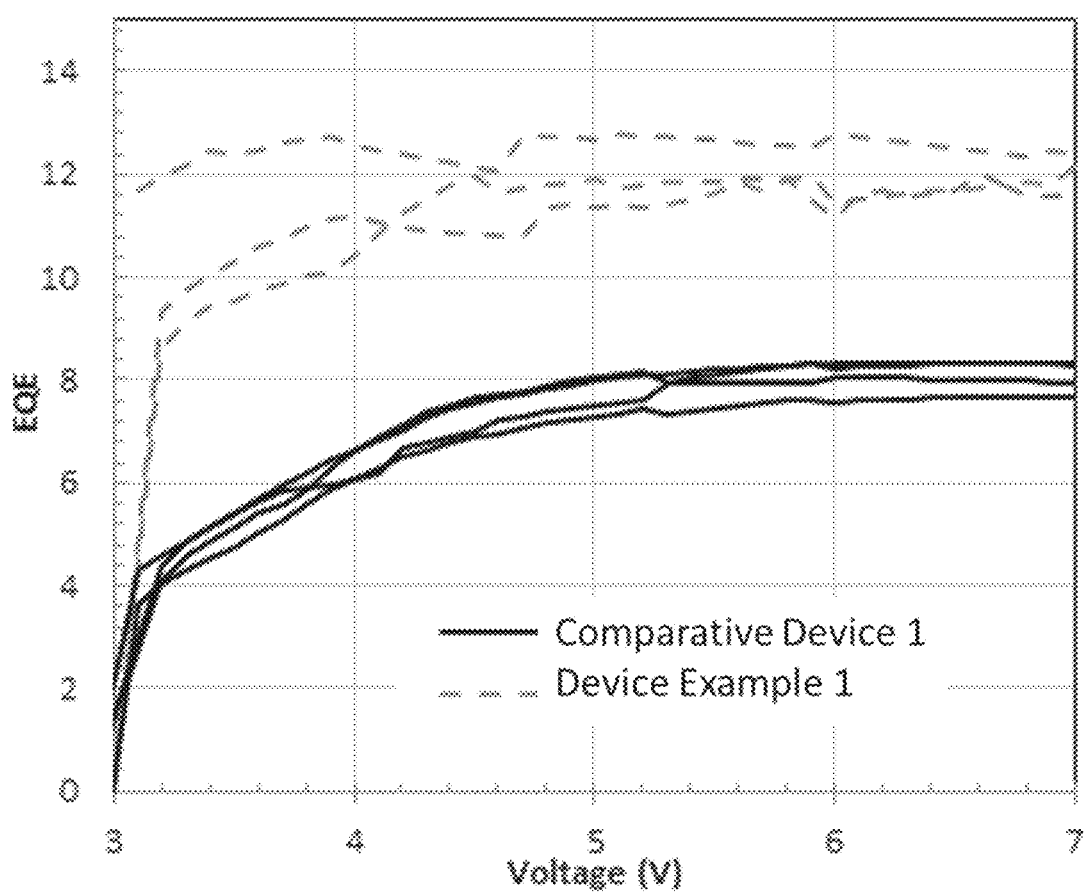
FIG. 8 is a graph of external quantum efficiency vs. voltage for an OLED according to an embodiment of the invention and a comparative device.

With reference to FIG. 8, external quantum efficiency for Device Example 1, containing Polymer Example 2, is about 50% higher than that of Comparative Device 1 containing Comparative Polymer 1.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A light-emitting polymer comprising a light-emitting repeat unit in a backbone of the polymer; wherein the polymer has an anisotropy factor α of no more than 0.8, wherein a transition dipole moment of the light-emitting repeat unit is aligned with the polymer backbone, wherein the light-emitting repeat unit is a phosphorescent repeat unit comprising a phosphorescent metal complex, wherein the polymer comprises one or more co-repeat units of formula (VI):

 (VI)

wherein Ar is an aryl or heteroaryl group that may be unsubstituted or substituted with one or more substituents, and angle θ is 180°±40°; and wherein the phosphorescent repeat units are separated from one another in the backbone by the one or more co-repeat units.

2. The light-emitting polymer according to claim 1, wherein the polymer has an anisotropy factor α of no more than 0.5.

3. The light-emitting polymer according to claim 1, wherein the phosphorescent metal complex is an iridium complex.

4. The light-emitting polymer according to claim 1, wherein the metal of the phosphorescent metal complex is in the polymer backbone.

5. The light-emitting polymer according to claim 1, wherein the light-emitting repeat unit comprises at least one C,N-cyclometalated ligand.

6. The light-emitting polymer according to claim 1, wherein the light-emitting repeat unit has formula (Va) or (Vb):

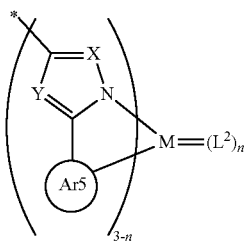

(Va)

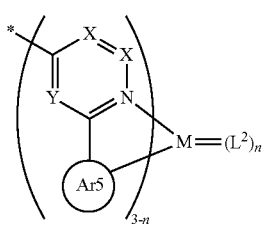

(Vb)

wherein M is a metal;
Ar⁵ is an aromatic group;
each X is independently N or $CR^{14}$ wherein $R^{14}$ independently in each occurrence is H or a substituent and two groups $R^{14}$ bound to the same ring may be linked to form a ring; each Y is independently N or $CR^{15}$ wherein each $R^{15}$ independently is H or a substituent; $L^2$ is a ligand which is different from

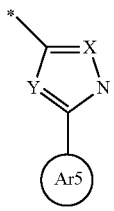

of formula (Va)

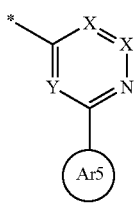

or of formula (Vb); and
n is 0, 1 or 2.

7. The light-emitting polymer according to claim 1, wherein the light-emitting repeat unit has a first binding position having a first bond vector and a second binding position having a second bond vector and wherein the first and second bond vectors are in the same direction along the polymer backbone.

8. A light-emitting polymer comprising a phosphorescent repeat unit in a backbone of the polymer wherein a transition dipole moment of the phosphorescent repeat unit is aligned with the polymer backbone.

9. An organic light-emitting device comprising an anode, a cathode and a light-emitting layer between the anode and the cathode wherein the light-emitting layer comprises a polymer according to claim 1.

10. A method of forming an organic light-emitting device according to claim 8, the method comprising the step of forming the light-emitting layer by depositing the polymer by a solution deposition method.

11. A method of forming a polymer comprising a light-emitting repeat unit in a backbone of the polymer, the method comprising the steps of:
  determining an orientation of a transition dipole moment of a light-emitting unit; and
  polymerising the light-emitting unit to form light-emitting repeat units in the polymer backbone,
  wherein the light-emitting unit is polymerised such that the transition dipole moment of the light-emitting unit is aligned with the polymer backbone.

12. A light-emitting polymer comprising a phosphorescent light-emitting repeat unit of formula (Va) or (Vb):

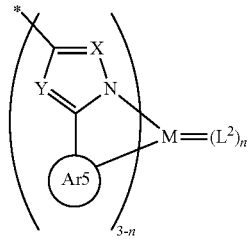

(Va)

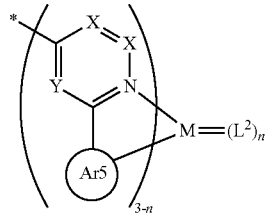

(Vb)

wherein M is a metal;
$Ar^y$ is an aromatic group;
each X is independently N or $CR^{14}$ wherein $R^{14}$ independently in each occurrence is H or a substituent and two groups $R^{14}$ bound to the same ring may be linked to form a ring; each Y is independently N or $CR^{15}$ wherein each $R^{15}$ independently is H or a substituent; $L^2$ is a ligand which is different from

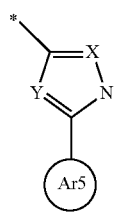

of formula (Va)

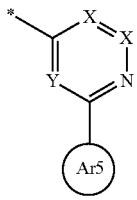

or of formula (Vb); and n is 0, 1 or 2.

13. A light-emitting polymer comprising a light-emitting repeat unit comprising a phosphorescent metal complex in a backbone of the polymer wherein:

the light-emitting repeat unit has a first binding position having a first bond vector, a second binding position having a second bond vector and a transition dipole moment having a transition dipole moment vector;

an average of a first angle between the first bond vector and the transition dipole moment vector and a second angle between the second bond vector and the transition dipole moment vector is no more than about 30°; and the polymer has an anisotropy factor $\alpha$ of no more than 0.8.

14. The light-emitting polymer according to claim 6, wherein n=1.

15. The light-emitting polymer according to claim 14, wherein $L^2$ is selected from the group consisting of N,N- N,O-, O,O- and N,O-chelating ligands.

16. The light-emitting polymer according to claim 12, wherein n=1.

17. The light-emitting polymer according to claim 16, wherein $L^2$ is selected from the group consisting of N,N- N,O-, O,O- and N,O-chelating ligands.

* * * * *